United States Patent
Wang et al.

(10) Patent No.: US 9,793,473 B2
(45) Date of Patent: Oct. 17, 2017

(54) MEMRISTOR STRUCTURES

(71) Applicant: Hewlett Packard Enterprise Development LP, Houston, TX (US)

(72) Inventors: Shih-Yuan Wang, Palo Alto, CA (US); Jianhua Yang, Palo Alto, CA (US); Minxian Max Zhang, Palo Alto, CA (US); Alexandre M. Bratkovski, Palo Alto, CA (US); R. Stanley Williams, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/914,808

(22) PCT Filed: Sep. 5, 2013

(86) PCT No.: PCT/US2013/058170
§ 371 (c)(1),
(2) Date: Feb. 26, 2016

(87) PCT Pub. No.: WO2015/034494
PCT Pub. Date: Mar. 12, 2015

(65) Prior Publication Data
US 2016/0218285 A1    Jul. 28, 2016

(51) Int. Cl.
*H01L 47/00* (2006.01)
*H01L 45/00* (2006.01)

(52) U.S. Cl.
CPC .......... *H01L 45/1253* (2013.01); *H01L 45/08* (2013.01); *H01L 45/12* (2013.01);
(Continued)

(58) Field of Classification Search
CPC ..... H01L 45/1253; H01L 45/08; H01L 45/12; H01L 45/1233; H01L 45/145; H01L 45/146; H01L 45/148; H01L 45/1608
See application file for complete search history.

(56) References Cited

U.S. PATENT DOCUMENTS 7,804,703 B2    9/2010  Ha et al.
8,212,232 B2    7/2012  Lee
(Continued)

FOREIGN PATENT DOCUMENTS

KR    20130021864 A1    3/2013
WO    WO-2013032983 A1    3/2013
(Continued)

OTHER PUBLICATIONS

International Searching Authority, The International Search Report and The Written Opinion, May 23, 2014, 12 Pages.
(Continued)

*Primary Examiner* — Yosef Gebreyesus
(74) *Attorney, Agent, or Firm* — Hewlett Packard Enterprise Patent Department (57) ABSTRACT

A memristor structure may be provided that includes a first electrode, a second electrode, and a buffer layer disposed on the first electrode. The memristor structure may include a switching layer interposed between the second electrode and the buffer layer to form, when a voltage is applied, a filament or path that extends from the second electrode to the buffer layer and to form a Schottky-like contact or a heterojunction between the filament and the buffer layer.

17 Claims, 4 Drawing Sheets

(52) U.S. Cl.
CPC ........ *H01L 45/1233* (2013.01); *H01L 45/145* (2013.01); *H01L 45/146* (2013.01); *H01L 45/148* (2013.01); *H01L 45/1608* (2013.01)

(56) References Cited

U.S. PATENT DOCUMENTS

| | | | |
|---|---|---|---|
| 8,350,262 | B2 | 1/2013 | Lee et al. |
| 2008/0006907 | A1 | 1/2008 | Lee et al. |
| 2010/0008128 | A1* | 1/2010 | Yoshii ................ G11C 13/0002 365/148 |
| 2011/0044089 | A1* | 2/2011 | Goux .................. G11C 11/5614 365/148 |
| 2011/0266513 | A1 | 11/2011 | Williams et al. |
| 2011/0317470 | A1* | 12/2011 | Lu ...................... G11C 13/0007 365/148 |
| 2012/0025163 | A1* | 2/2012 | Onishi ................ H01L 27/2436 257/4 |
| 2012/0043519 | A1* | 2/2012 | Jo ....................... G11C 13/0009 257/4 |
| 2012/0168705 | A1 | 7/2012 | Liu et al. |
| 2013/0214235 | A1 | 8/2013 | Hong et al. |
| 2014/0185358 | A1* | 7/2014 | Jo ....................... G11C 13/0007 365/148 |
| 2014/0268998 | A1* | 9/2014 | Jo ....................... H01L 45/1253 365/148 |

FOREIGN PATENT DOCUMENTS

| | | |
|---|---|---|
| WO | WO-2013058760 A1 | 4/2013 |
| WO | WO-2013066342 A1 | 5/2013 |

OTHER PUBLICATIONS

Sacchette et al., Memristive Devices Fabricated with Silicon Nanowire Schottky Barrier Transistors, 2010 IEEE, Jan. 2010, pp. 9-12.

* cited by examiner

MEMRISTOR STRUCTURES

BACKGROUND

Electronic devices have been minimized in size to improve their functionality. Many current electronic devices are based on sub-micron design rules. Recently, research and development efforts have been directed towards exploring devices on the nanoscale, with the dimensions of the devices often measured in nanometers or tens of nanometers.

In addition to the significant reduction of individual device size and much higher packing density as compared to microscale devices, nanoscale devices may also provide new functionalities due to physical phenomena on the nanoscale that are not observed on the micron scale. For example, nanoscale devices may exhibit resistance electronic switching behavior, which has been linked to memristor circuit element theory.

BRIEF DESCRIPTION OF THE DRAWINGS

Some examples are described with respect to the following figures.

DETAILED DESCRIPTION

Before particular examples of the present disclosure are disclosed and described, it is to be understood that this disclosure is not limited to the particular examples disclosed herein as such may vary to some degree. It is also to be understood that the terminology used herein is used for the purpose of describing particular examples only and is not intended to be limiting, as the scope of the present disclosure will be defined only by the appended claims and equivalents thereof. Notwithstanding the foregoing, the following terminology is understood to mean the following when recited by the specification or the claims. The singular forms "a," "an," and "the" include plural referents unless the context clearly dictates otherwise. The term "about" means a ±10% variance caused by, for example, variations in manufacturing processes.

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc.

The present disclosure concerns memristor structures and methods of fabricating memristor structures. Memristors may be nanoscale devices that may employ resistance switching, and that may be used as components in a wide range of electronic circuits, such as memories, switches, and logic circuits and functions. When used as a logic circuit, a memristor may be employed as bits in a logic circuit that resembles a Field Programmable Gate Array, or may be the basis for a wired-logic Programmable Logic Array. When used as a basis for memories, a memristor may be used to store a bit of information, 1 or 0. For example, a memristor may have an OFF state and an ON state. The ON state may have a lower resistance than the OFF state. In a memory structure, a crossbar of memristor structures may be used. A crossbar may be an array of switches that can connect each wire in one set of parallel wires to every member of a second set of parallel wires that intersects the first set. The two sets of wires may be perpendicular to each other, but this is not necessary. When used as a switch, the memristor may either be a closed or open switch such as in a cross-point memory.

The materials, components, and dimensions of the memristor structures of the present disclosure may be selected such that the memristor structures may achieve high resistances such as about 10 MΩ (megaohms) in OFF states and about 0.1 MΩ in ON states, may achieve superior non-linear relationships between current and voltage, may decrease current leakage and/or dopant leakage, and/or may achieve superior diode characteristics. These characteristics, including the high resistances in both the ON and OFF states, may be suitable for a number of applications. For example, the memristor structures of the present disclosure may be suitable for high density non-volatile memory applications, high-density crossbar memristor architectures, and back end of line (BEOL) fabrication processes of integrated circuits with complementary metal-oxide-semiconductor (CMOS) processes. Certain types of memristor structures comprise switching layers of a material which is normally insulating, but which can be made to be conducting or semiconducting through one or more filaments or conducting or semiconducting paths formed after application of a sufficiently high voltage. The conducting or semiconducting path can be formed by different mechanisms, including defects, metal or dopant migration, for instance. Once the conducting or semiconducting filament is formed, it may be reset or set by a voltage applied across the structure to provide the memristive properties of the structure. In the following description, the formation and manipulation of a single such filament will be described, although it will be understood that in real devices, multiple such filaments may potentially exist.

Figure 1:
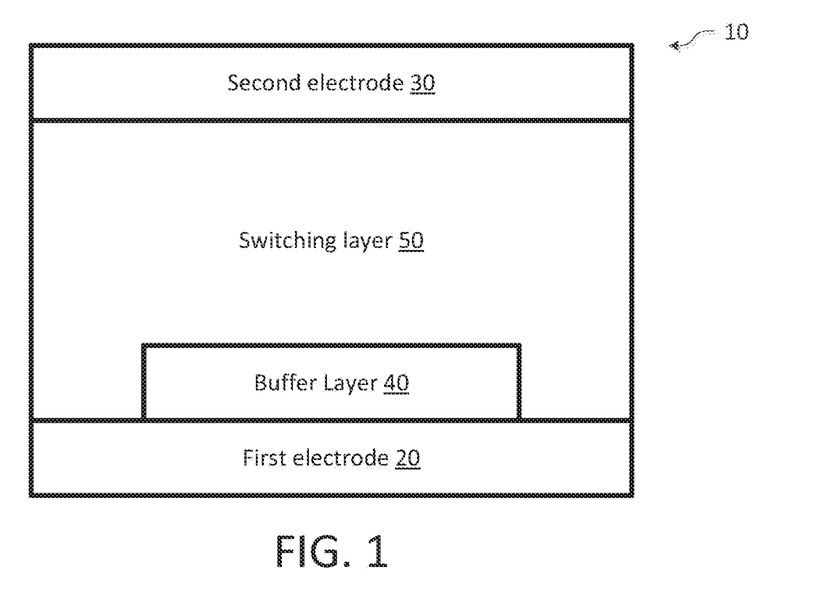
FIG. 1 is a schematic cross-sectional view illustrating a memristor structure according to some examples.

Accordingly, FIG. 1 is a cross-sectional view of a memristor structure 10 according to some examples. The memristor structure 10 may include a first electrode 20 and a second electrode 30. The memristor structure 10 may include a buffer layer 40 that may be disposed on the first electrode 20. The memristor structure 10 may include a switching layer 50 that may be interposed between the second electrode 30 and the buffer layer 40 to form, when a voltage is applied, one or more conducting or semiconducting filaments or paths that extend from the second electrode 30 to the buffer layer 40 and to form between each filament or path and the buffer layer 40 a junction selected from the group consisting of a Schottky-like contact and a heterojunction. The memristor structure 10 is shown in FIG. 1 in a state in which a filament or path has not yet formed. As understood herein, a "Schottky-like contact" is an electric potential barrier at an interface between a metal and a semiconductor, a "heterojunction" is an interface between two semiconductors that are dissimilar in material and/or structure, and the term "buffer" in "buffer layer" means that the buffer layer prevents the first electrode 20 from directly contacting a filament. Additionally, as understood herein, a "conductor", "conducting material", or a term that is a variant thereof, is a material allowing flow of electrical charges, i.e. is electrically conductive. A "semiconductor", "semiconducting material", or a term that is a variant thereof, is a material having electrical conductivity to a degree between that of a conductor and an insulator.

Figure 2:
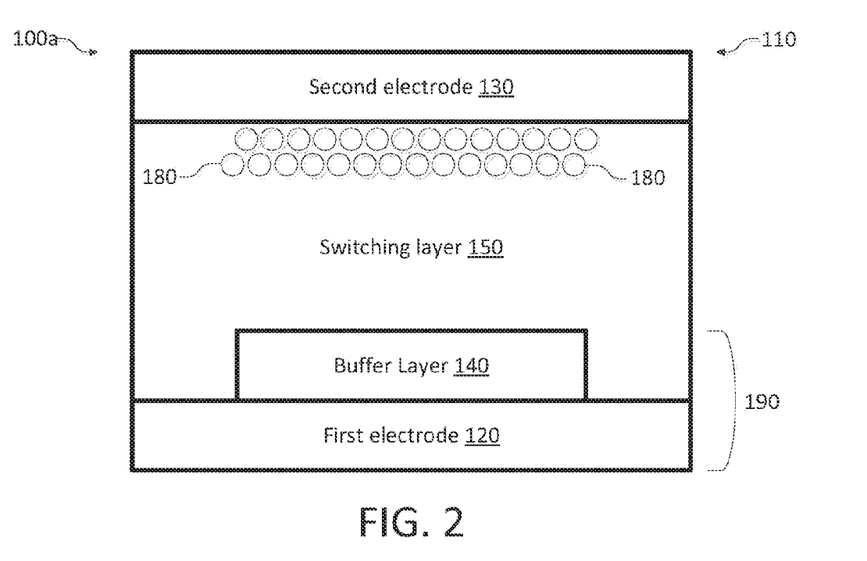
FIG. 2 is a schematic cross-sectional view illustrating a memristor structure in an OFF state and having a buffer layer made of polycrystalline material according to some examples.
Figure 3:
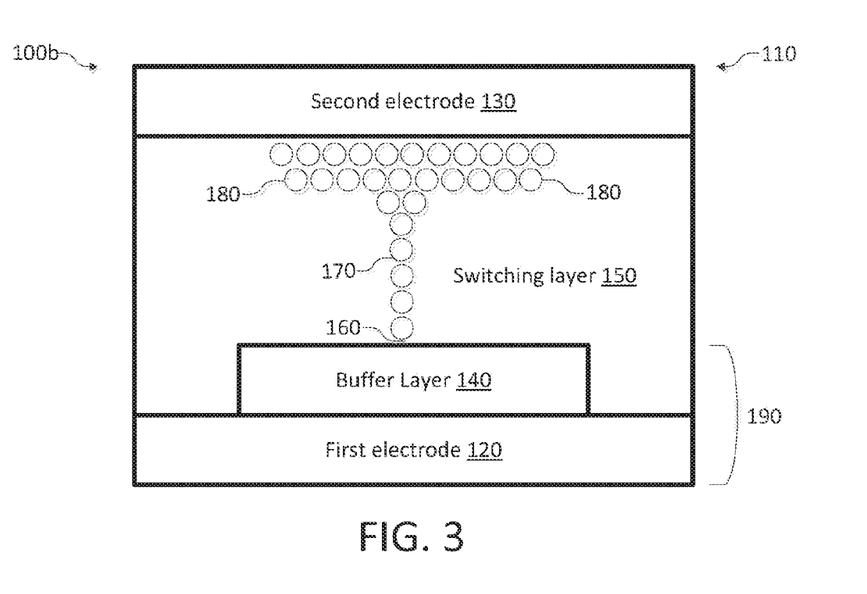
FIG. 3 is a schematic cross-sectional view illustrating a memristor structure in an ON state and having a buffer layer made of polycrystalline material according to some examples.

FIG. 2 is a cross-sectional view of a memristor structure 110 in an OFF state 100a according to some examples, and FIG. 3 is a cross sectional view of the memristor structure 110 in an ON state 100b according to some examples. The memristor structure 110 may include a first electrode 120 and a second electrode 130. The memristor structure 110 may include a buffer layer 140 that may be disposed on the first electrode 120. The first electrode 120 and the buffer layer 140 may together define a composite electrode 190. In some examples, the first electrode 110 may be a bottom electrode and the second electrode 120 may be a top electrode. In other examples, the first electrode 110 may be a top electrode and the second electrode 120 may be a bottom electrode. The memristor structure 110 may include a switching layer 150 that may be interposed between the second electrode 130 and the buffer layer 140. The functional dimension of the memristor structure 110 may be in the nanometer range, for example less than about 50 nm or less than about 100 nm. The lateral dimensions may be in the range of nanometers, sub-microns, or microns.

The switching layer 150 may form a filament or path 170 that may be between the second electrode 130 and the buffer layer 140. For example, the switching layer 150 may form the filament or path 170 that may extend from the second electrode 130 to the buffer layer 140 due to an electric field concentrating effect in this region resulting from the presence of the buffer layer 140. Thus, a junction 160 may be formed between the filament 170 and the buffer layer 140. The junction 160 may be selected from the group consisting of a Schottky-like contact and a heterojunction. For example, the memristor structure 110 may include a configuration selected from the group consisting of following examples. In some examples, the filament 170 may be a conducting structure and the buffer layer 140 may include a semiconductor material to form a Schottky-like contact between the filament 170 and the buffer layer 140. In other examples, the filament 170 may be a semiconducting structure and the buffer layer 140 may include a conductor material to form a Schottky-like contact between the filament 170 and the buffer layer 140. In yet other examples, the filament 170 may be a semiconducting structure and the buffer layer 140 may include a semiconductor material to form a heterojunction between the filament 170 and the buffer layer 140. FIG. 2 shows the memristor structure 110 in a state in which no filament has yet formed. FIG. 3 shows the memristor structure 110 in a state in which a filament 170 has formed. Eleven example configurations are shown in eight respective rows of Table 1 below:

TABLE 1

| Filament 170 | Junction 160 | Buffer Layer 140 |
| --- | --- | --- |
| Conductor | Schottky-like contact | Polycrystalline semiconductor |
| Semiconductor | Schottky-like contact | Polycrystalline conductor |
| Semiconductor | Heterojunction | Polycrystalline semiconductor |
| Conductor | Schottky-like contact | Amorphous semiconductor |
| Semiconductor | Schottky-like contact | Amorphous conductor |
| Semiconductor | Heterojunction | Amorphous semiconductor |
| Conductor | Schottky-like contact | Semiconducting nanoparticles |

TABLE 1-continued

| Filament 170 | Junction 160 | Buffer Layer 140 |
| --- | --- | --- |
| Semiconductor | Schottky-like contact | Conducting nanoparticles |
| Semiconductor | Heterojunction | Semiconducting nanoparticles |
| Conductor | Schottky-like contact | Semiconducting quantum dots |
| Semiconductor | Heterojunction | Semiconducting quantum dots |

In each of the above examples, the first electrode 120 and the second electrode 130 may each include electrode materials such as conductive materials. In some examples, the electrode materials may each include one or more of aluminum (Al), copper (Cu), gold (Au), molybdenum (Mo), niobium (Nb), palladium (Pd), platinum (Pt), ruthenium (Ru), ruthenium oxide ($RuO_2$), silver (Ag), tantalum (Ta), tantalum nitride (TaN), titanium nitride (TiN), tungsten (W), tungsten nitride (WN), a silicide such as nickel silicide (NiSi), platinum silicide (PtSi), tantalum silicide ($Ta_2Si$ or $TaSi_2$), or tungsten silicide (WSi), or another material, such as ruthenium oxide ($RuO_2$). The material chosen for the first and second electrode need not be the same. Each of the first electrode 120 and the second electrode 130 may have thicknesses in the range of about 5 nm to about a few micrometers.

As shown in FIGS. 2 and 3, the buffer layer 140 may be coated on the center of the first electrode 120. However, in other examples, the buffer layer 140 may be uniformly coated on the entire surface of the first electrode 120. The buffer layer 140 may have a thickness in the range of about 10 nm to about 100 nm, or less than about 50 nm.

In examples in which the buffer layer 140 includes a semiconductor material, the buffer layer 140 may be a thin film of semiconductor, and may include a polycrystalline or amorphous semiconductor, semiconducting nanoparticles, and/or semiconducting quantum dots. The polycrystalline semiconductor may, for example, be polycrystalline silicon (c-Si), amorphous silicon (a-Si), polycrystalline gallium nitride (GaN), polycrystalline germanium (Ge), polycrystalline zinc oxide (ZnO) or another semiconductor material. The semiconducting nanoparticles may, for example, be polycrystalline silicon (Si), polycrystalline gallium nitride (GaN), polycrystalline germanium (Ge) or another polycrystalline semiconductor material. The semiconducting nanoparticles or the semiconducting quantum dots may, for example, be made of silicon (Si), gallium nitride (GaN), germanium (Ge), indium phosphide (InP), or gallium arsenide (GaAs), or another semiconductor material. The semiconducting quantum dots may be made in a core-shell configuration, in which each semiconducting quantum dot may be located in a core surrounded by a different semiconductor material.

A "polycrystalline" material is a solid material made of crystallites of different sizes and orientations. An "amorphous" material is a solid non-crystalline material. A "nanoparticle" is a small fragment of material, typically sized between 1 and 100 nm across, or less than about 10 nm across. A "quantum dot" is a nanocrystal, i.e. a nanometer-sized single crystal, made of semiconductor material that is small enough to display quantum mechanical properties.

Any of the semiconductor materials above of the buffer layer 140 may be un-doped or low-doped. For example, if the semiconductor material is un-doped, the intrinsic dopant concentration of the semiconductor material may be about $10^{14}$ dopants per $cm^3$. If the semiconductor material is low-doped, the dopant concentration of the semiconductor material may be in the range of about $10^{16}$ dopants per $cm^3$ to about $10^{17}$ dopants per cm$^3$. Low-doping may reduce series resistance, which may result in suitable Schottky-like contact or heterojunction characteristics.

In examples in which the buffer layer 140 includes a conductor material, the buffer layer 140 may be a thin film of conductor, and may include a polycrystalline conductor and/or conducting nanoparticles. The polycrystalline conductor and/or conducting nanoparticles may, for example, be made of aluminum (Al), copper (Cu), gold (Au), molybdenum (Mo), niobium (Nb), palladium (Pd), platinum (Pt), ruthenium (Ru), ruthenium oxide (RUO$_2$), silver (Ag), tantalum (Ta), tantalum nitride (TaN), titanium nitride (TiN), tungsten (W), tungsten nitride (WN), a silicide such as nickel silicide (NiSi), platinum silicide (PtSi), tantalum silicide (Ta$_2$Si or TaSi$_2$), or tungsten silicide (WSi), or another material.

In some examples, the switching layer 150 may include an insulating or wide band gap semiconducting material to form a conducting filament 170. For example, the switching layer 150 may include transition metal oxides, such as tantalum oxide (TaO$_x$), yttrium oxide (YO$_x$), hafnium oxide (HfO$_x$), zirconium oxide (ZrO$_x$), titanium oxide (TiO$_x$) or other like oxides, or may include a metal oxides, such as aluminum oxide (AlO$_x$), calcium oxide (CaO$_x$), magnesium oxide (MgO$_x$) or other like oxides. In some examples, the switching layer 150 may include insulator nitrides such as aluminum nitride (AlN). In some examples, the switching layer 150 may include materials such as the oxide form of the metal of the first electrode 110 and/or the second electrode 120. In some examples, the switching layer 150 may include materials that may be formed of ternary oxides, quaternary oxides, or other complex oxides, such as strontium titanate oxide (STO) or praseodymium calcium manganese oxide (PCMO). In some examples, the switching layer 150 may include materials made of nitrides or sulfides, such as nitride or sulfide forms of conducting materials.

In some examples, the switching layer 150 may include an insulating or wide band gap semiconducting material to form a semiconducting filament 170. For example, the switching layer 150 may include an oxide form of a semiconducting material, such as silicon oxide (SiO$_x$) or germanium oxide (GeO$_x$). In some examples, the switching layer 150 may include materials that may be formed of ternary oxides, quaternary oxides, or other complex oxides. In some examples, the switching layer 150 may include materials made of nitrides or sulfides, such as a nitride or sulfide forms of semiconducting materials. In such examples, the memristor structure 110 may function in substantially the same manner as the memristor structure 110 including an oxide based switching layer 150, although in such examples the filament 170 may be a narrower-gap semiconducting structure relative to un-doped wider-bandgap semiconducting parts of the switching layer 150. In some examples, the switching layer 150 may include a semiconducting material such as silicon (Si), germanium (Ge), gallium nitride (GaN), gallium arsenide (GaAs), indium phosphide (InP), or gallium-aluminum nitride (GaAlN). In these examples, the filament 170 may be in a different phase of the semiconductor, or may include impurity dopants as will be described in more detail below.

The "x" in "O$_x$" is the ratio of the oxide to the metal or semiconductor, or the number of oxygen atoms per metal or semiconductor atom. For example, x=2.5 is equivalent to TaO$_{2.5}$=Ta$_2$O$_5$. This is in contrast to the use of "x" in a metal oxide formula such as Ta$_2$O$_{5-x}$ (or TaO$_2$O$_{2.5-x}$), in which case "x" is used to denote the oxygen deficiency from Ta$_2$O$_5$. In the example metal and semiconductor oxides listed above, x may be equal to 1, 1.5, 2, 2.5, or any other value for which the metal and semiconductor oxides may form.

In examples in which the filament 170 and buffer layer 140 are each semiconducting, in which case the junction 160 may be a heterojunction, the heterojunction may be a p-n heterojunction. In some examples, the filament 170 may be a p-type semiconductor, and the buffer layer 140 may be an n-type semiconductor. In other examples, the filament 170 may be an n-type semiconductor, and the buffer layer 140 may be a p-type semiconductor.

In some examples, the switching layer 150 may be a thin film. In some examples, the switching layer 150 may have a thickness in the range of about 10 nm to about 100 nm, or about 10 nm to about 200 nm, or less than about 50 nm, from the second electrode 130 to the buffer layer 140. In some examples, the memristor structure's switching layer 120 may consist of a single-layer, a bi-layer, or a multi-layer structure, with materials selected from combinations of those mentioned above.

The switching of the memristor structure 110 may be achieved in the switching layer 150 by formation in the memristor structure 110 of the filament 170 to form the junction 160 between the buffer layer 140 and the filament 170. The material of the switching layer 150, when not doped, may be a wide band-gap semiconductor or insulator. However, the material of the switching layer 150 may include dopants 180, which may be native dopants, such as oxygen vacancies, nitrogen vacancies, or sulfur vacancies, or may be impurity dopants, such as metal ions or semiconductor ions that are different from the materials of the switching layer 150 and which are intentionally introduced into the switching layer 150. Examples of impurity dopants include aluminum (Al), copper (Cu), gold (Au), molybdenum (Mo), niobium (Nb), palladium (Pd), platinum (Pt), ruthenium (Ru), ruthenium oxide (RuO$_2$), silver (Ag), tantalum (Ta), tantalum nitride (TaN), titanium nitride (TiN), tungsten (W), tungsten nitride (WN), a silicide such as nickel silicide (NiSi), cobalt silicide (CoSi), platinum silicide (PtSi), or tungsten silicide (WSi), cobalt (Co), silicon (Si), gallium nitride (GaN), germanium (Ge), indium phosphide (InP), and gallium arsenide (GaAs).

The dopants 180 may be electrically charged and mobile under electric fields, and thus the region of the material having the dopants 180 may be a weak ionic conductor, for example doped TaO$_x$ in which the dopants 180 are oxygen vacancies, or a weak ionic semiconductor, for example doped SiO$_x$ in which the dopants 180 are oxygen vacancies. Thus, "weakly ionic conductor" may be a conductor in which mobility of dopants 180 is small enough such that they do not diffuse upon application of an electric field, thus ensuring stability of the OFF state 100a or the ON state 100b for as long as necessary under the desired conditions. By contrast, a "strongly ionic conductor" may have large ionized species mobilities and thus may not be stable against diffusion.

Accordingly, the species of the dopants 180 may be selected (1) such that the concentration profile of the dopants 180 inside the materials of the switching layer 150 may be reconfigurable by electric fields, resulting in changes to the resistance of the memristor structure 110 under electric fields, namely electrical switching, (2) but such that the dopants 180 may not drift too easily, so that when no electric field is applied to the memristor structure 110, the switching layer 150 may persist in whatever state it is set for a long period of time, such as many months or years at room temperature. The term "reconfigurable" means that a switch can be opened and closed multiple times such as the memory bits in a random access memory (RAM). Thus, the switching layer 150 may be non-volatile, such that the switching layer 150 may hold its state after the electric field has been removed. Additionally, the switching layer 150 may be a two-terminal device. For example, applying a strong electric field to the switching layer 150 may cause both electron current to flow through the filament 170 and the dopants 180 to reconfigure, whereas applying a relatively weaker electric field may cause electronic current to flow but ion current may be negligible, which may allow the switching layer 150 to hold its resistance state.

Figure 4:
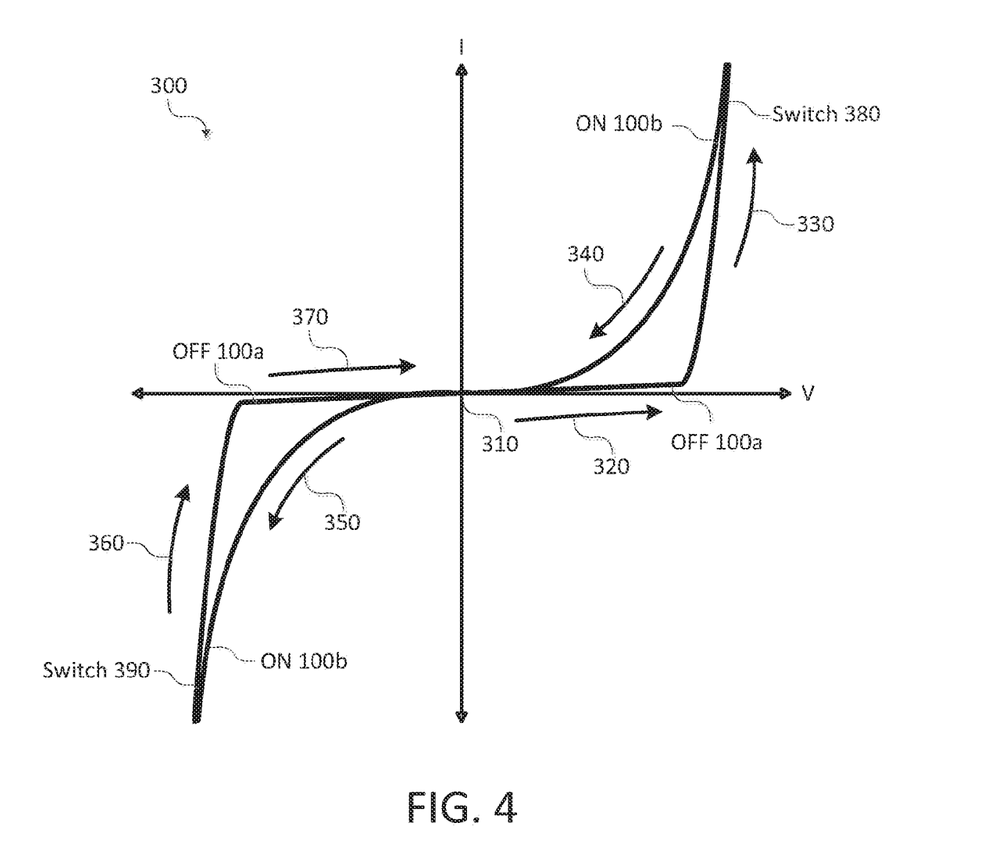
FIG. 4 is a chart illustrating a current-voltage relationship of a memristor structure according to some examples.

FIG. 4 is a chart illustrating a current-voltage (I-V) relationship 300 of a memristor structure 110 according to some examples. In other examples, the memristor structure 110 may have other current-voltage relationships. As shown in FIG. 4, the current-voltage relationship 300 may exhibit hysteresis. In describing an example cycle of operation of the memristor structure 110, reference to FIGS. 2-4 will be made.

The memristor structure 110 may originally be in the OFF state 100a at the origin 310. The dopants 180 may be uniformly distributed near the second electrode 130, and the region having the dopants 180 may not be in contact with the buffer layer 140, as shown in FIG. 2. Thus, the memristor structure 110 may be in the OFF state 100a and may thus have a high resistance, such as about 10 megaohms (MΩ) or in the range of about 1 MΩ to about 100 MΩ, to the voltage supplied between the first electrode 120 and the second electrode 130. As shown in FIG. 2, the dopants 180 may be distributed near the center of the second electrode 130 to reduce dopant leakage.

Upon application of an appropriate voltage to the memristor structure 110 of FIG. 2 in the OFF state 100a following path 320, the memristor structure 110 may enter a switch region 380 along path 330. At the switch region 380, the concentration profile of the dopants 180 may become configured as in FIG. 3, wherein the dopants 180 may, in response to the applied voltage, move in the electric field to form the conducting or semiconducting filament 170, which may, for example, be in the range of about 1 nm to about 50 nm in diameter and which may contact the buffer layer 140 at the junction 160 to cause the memristor structure 110 to be in the ON state 100b. The voltage applied during the normal operation of the switch may be sufficient for forming the filament 170.

In some examples, diffusion of dopants 180 may occur through grain boundaries, pores, or local structural imperfections of the material of the switching layer 150. Also, because of the switching layer 150 may be thin, the amount of time required for dopants 180 to drift sufficiently to substantially change the conductivity of the switching layer 150 may be relatively rapid. For example, the time required for a diffusive process may vary as the square of the distance covered, such that the time to diffuse one nanometer may be one-millionth the time required to diffuse one micrometer.

The memristor structure in the ON state 100b may have a relatively lower resistance, such as about 0.1 megaohm (MΩ) or in the range of about 0.01 MΩ to about 1 MΩ, to the voltage supplied between the first electrode 120 and the second electrode 130. The central placement of the buffer layer 140 on the first electrode 120, and/or the materials of the buffer layer 140, may cause the electric field to configure the dopants 180 in the shape of the filament 170 rather than configuring the dopants 180 uniformly through the switching layer 150. In some examples, the formation of the filament 170 may be aided by an electric field concentrating effect due to the non-uniformity and non-continuousness of the materials of the buffer layer 140, such as due to the non-uniformity and/or non-continuousness of polycrystals, amorphous materials, nanoparticles, and/or quantum dots, as compared to uniform materials and/or continuous materials. As shown in FIG. 3, the junction 160 may be localized, for example wherein the lateral area of contact at the junction 160 between the filament 170 and the buffer layer 140 may be substantially smaller than the area of the buffer layer 140 contacting the switching layer 150, or wherein the lateral area of contact at the junction 160 between the filament 170 and the buffer layer 140 may be substantially smaller than the lateral area of the first electrode 120 contacting one or both of the buffer layer 140 and the switching layer 150. Localization of the junction 160, for example at substantially the center of the first electrode 120, may result in superior non-linear current-voltage relationships as in FIG. 4, and may decrease current leakage and/or dopant leakage from the memristor structure 110 because the dopants 180 may be located in the interior of the memristor structure 110 in the ON state 110b.

The applied voltage may be removed following path 340 in the ON state 100b. The concentration profile of FIG. 3 may persist after the voltage is removed, and thus the memristor structure 110 may persist in the OFF state 100a at the origin 310.

Upon application of an appropriate voltage to the memristor structure 110 of FIG. 3 in the ON state 100b following path 350, the memristor structure 110 may enter a switch region 390 along path 360. At the switch region 390, the concentration profile of the dopants 180 may, in response to the applied voltage, become uniformly distributed near the second electrode 130 as in FIG. 2 to cause the memristor structure 110 to be in the OFF state 100a. The voltage applied during the normal operation of the switch may be sufficient for changing the concentration profile from the filament 170 of FIG. 3 to the uniform distribution of FIG. 2.

The applied voltage may be removed following path 370 in the OFF state 100a. The concentration profile of FIG. 2 may persist after the voltage is removed, and thus the memristor structure 110 may persist in the OFF state 100a at the origin 310.

Various non-linear aspects of the current-voltage relationship 300 may be achieved by inclusion of buffer layer 140 and a resultant Schottky-like contact or heterojunction. For example, suitable non-linear interface behavior may be provided at the junction 160 due to the by the buffer layer 140, such as current-voltage characteristics in which resistance decreases as voltage increases, to achieve the following.

For high applied voltages while in the OFF state 100a or the ON states 100b, the buffer layer 140 may become highly conducting, thus most of the voltage drop may occur in the switching layer 150 and a minority of the voltage drop may occur in the buffer layer 140. This may allow for switching in the switching region 380.

For low applied voltages while in the OFF state 100a, the buffer layer 140 may become relatively less conducting than for high applied voltages, thus relatively less of the voltage drop may occur in the switching layer 150 than at high applied voltages. This may decrease the risk of undesired dopant movement or dopant leakage, and may cause high resistance, such as about 10 MΩ, in the OFF state 100a region in FIG. 4.

For low applied voltages while in the ON state 100b, particularly near the origin 310, the buffer layer 140 may become relatively less conducting than for high applied voltages, thus relatively less of the voltage drop may occur in the switching layer 150 than at high applied voltages. This may decrease the risk of undesired dopant movement or dopant leakage, and may cause high resistance, such as about 1 MΩ, in the ON state 100b region in FIG. 4, although not as high as in the OFF state 100a.

In some examples, when a voltage is applied in a passive crossbar array to a first memristor structure 110 through which current flow is intended, some voltage may also be applied to a second memristor structure 110. However, because the second memristor structure 110 may have increased non-linearity in its current-voltage characteristics resulting in relatively high resistance at low voltages in the ON state 100b, "sneak path currents" through the second memristor 110 may be significantly lowered. As understood herein, a "sneak path current" is an unintended electrical current path through a memristor structure 110.

In some examples, the memristor structure 110 may be made of suitable materials such that the memristor structure 110 may be a multilevel cell, in which bits may be stored as different resistance levels in chip cells. These levels may be changed by applying a voltage to the cells in the manner above, except that there may be additional stable states buffer to the ON state 100b and OFF state 100a. $TaO_x$, for example, may have an almost unlimited number of buffer states between ON state 100b and the OFF state 100a. In such examples, the current-voltage relationship may be different than the current-voltage relationship 300 of FIG. 4.

Figure 5:
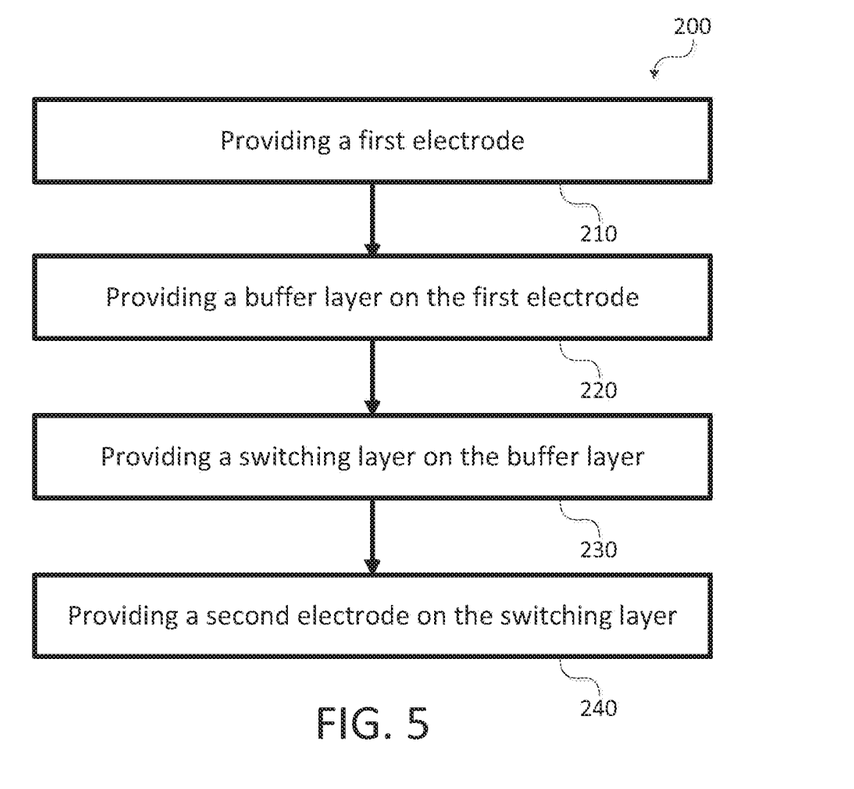
FIG. 5 is a flow chart depicting a method of fabricating a memristor structure according to some examples.

FIG. 5 is a flow chart depicting a method 200 of fabricating a memristor structure 110 according to some examples. In some examples, the ordering may be varied, such that some steps may be omitted, further steps may be added, and some steps may be modified.

At block 210, the first electrode 120 may be provided and formed. At block 220, the buffer layer 140 may be provided and formed on the first electrode 120 as a first layer. At block 230, the switching layer 150 may be provided and formed on the buffer layer 140 as a second layer. If the buffer layer 140 is not coated on the entire lateral area of the first electrode 120, for example if the buffer layer 140 is located on a central portion of the lateral area of the first electrode 120, then the switching layer may be additionally coated on the lateral area of the first electrode 120 that is not coated by the buffer layer 140. The switching layer 150 may, for example, be provided with any initial configuration of dopants 180, such as with the concentration profile of dopants 180 shown in FIG. 2. Thus, the filament 170 need not be initially formed. At block 240, the second electrode 130 may be provided and formed on the switching layer 150. Each step may be performed by any suitable process, such as sputtering, evaporation such as thermal evaporation or electron beam evaporation, atomic layer deposition, co-deposition, chemical vapor deposition, ion beam assisted deposition, etching, lithography, anodization, or any other film deposition technology.

In other examples, the second electrode 130 may be provided and formed first, the switching layer 150 may be provided and formed on the second electrode 130 second as a first layer, the buffer layer 140 may be provided and formed on the switching layer 150 third as a second layer, and the first electrode 120 may be provided and formed on the buffer layer 140 and on any part of the switching layer 150 that is not coated by the buffer layer 140 fourth. In these examples, the layers may be provided and formed in substantially the same way as described above.

It should be understood that the memristor structures described herein, such as the example memristor structures depicted in FIGS. 1-3 may include additional components and that some of the components described herein may be removed and/or modified in some examples. It should also be understood that the components depicted in these Figures are highly schematic and not drawn to scale and thus, the components may have different relative sizes with respect to each other than as shown therein. For example, the electrode 110 may be arranged substantially perpendicularly to the electrode 120 or may be arranged at some other non-zero angle with respect to each other. As another example, the switching layer 150 may be relatively smaller or relatively larger than the first electrode 110 or the second electrode 120.

Thus, there have been described examples of memristor structures and methods of fabricating memristor structures. In the foregoing description, numerous details are set forth to provide an understanding of the subject disclosed herein. However, examples may be practiced without some or all of these details. Other examples may include modifications and variations from the details discussed above. It is intended that the appended claims cover such modifications and variations.

What is claimed is:

1. A memristor structure comprising:
   a first electrode;
   a second electrode;
   a buffer layer disposed on the first electrode and coated on a center of and not on edges of the first electrode; and
   a switching layer interposed between the second electrode and the buffer layer to form, when a voltage is applied, a semiconducting filament that extends from the second electrode to the buffer layer and to form between the semiconducting filament and the buffer layer a junction selected from the group consisting of a Schottky-like contact and a heterojunction.

2. The memristor structure of claim 1 wherein the buffer layer comprises a conductor material to form the Schottky-like contact between the filament and the buffer layer.

3. The memristor structure of claim 1 wherein the buffer layer comprises a semiconductor material to form the heterojunction between the semiconducting filament and the buffer layer.

4. The memristor structure of claim 1 wherein the buffer layer comprises a polycrystalline or amorphous material.

5. The memristor structure of claim 1 wherein the buffer layer comprises nanoparticles or quantum dots.

6. The memristor structure of claim 1 wherein the buffer layer comprises a semiconducting material selected from the group consisting of silicon, gallium nitride, germanium, zinc oxide, indium phosphide, and gallium arsenide.

7. The memristor structure of claim 1 wherein the buffer layer comprises a conducting material selected from the group consisting of aluminum, copper, gold, molybdenum, niobium, palladium, platinum, ruthenium, ruthenium oxide, silver, tantalum, tantalum nitride, tantalum silicide, titanium nitride, tungsten, tungsten nitride, nickel silicide, platinum silicide, and tungsten silicide.

8. The memristor structure of claim 1 wherein:
   the switching layer comprises an oxide and oxygen-vacancy dopants;
   the switching layer comprises a nitride and nitrogen-vacancy dopants; or
   the switching layer comprises a sulfide and sulfur-vacancy dopants.

9. The memristor structure of claim 1 wherein the switching layer comprises a material selected from the group consisting of silicon oxide and germanium oxide, wherein the switching layer is doped such that the filament is semiconducting.

10. The memristor structure of claim 1 wherein the switching layer comprises a material selected from the group consisting of tantalum oxide, yttrium oxide, hafnium oxide, zirconium oxide, titanium oxide, aluminum oxide, calcium oxide, magnesium oxide, strontium titanate oxide.

11. The memristor structure of claim 1 wherein the buffer layer is selected from the group consisting of a polycrystalline semiconductor, amorphous semiconductor, semiconducting nanoparticles, and semiconducting quantum dots.

12. A method of fabricating a memristor structure, the method comprising:
providing a first electrode;
providing a buffer layer or a switching layer on the first electrode as a first layer, the buffer layer coated on a center of and not on edges of the first electrode;
providing a second electrode on top of the switching layer, wherein the switching layer is to form, when a voltage is applied, a semiconducting filament that extends from the second electrode to the buffer layer and to form between the semiconducting filament and the buffer layer a junction selected from the group consisting of a Schottky-like contact and a heterojunction.

13. The method of claim 12 wherein the buffer layer comprises a conductor material to form the Schottky-like contact.

14. The method of claim 12 wherein the buffer layer comprises a semiconductor material to form the heterojunction.

15. A memristor structure comprising:
a first electrode;
a second electrode;
a buffer layer on the first electrode, the buffer layer coated on a center of and not on edges of the first electrode; and
a switching layer between the second electrode and the buffer layer to form, in response to an applied voltage, a semiconducting path between the second electrode and the buffer layer and to form between the semiconducting path and the buffer layer a junction selected from the group consisting of a Schottky-like contact and a heterojunction.

16. The memristor structure of claim 15 wherein the buffer layer comprises a polycrystalline material, amorphous material, nanoparticles, or quantum dots.

17. The memristor structure of claim 15 wherein the buffer layer comprises a conductor material to form the Schottky-like contact between the filament and the buffer layer.

* * * * *